(12) United States Patent
Chang et al.

(10) Patent No.: US 9,741,689 B2
(45) Date of Patent: *Aug. 22, 2017

(54) 3-D PACKAGE HAVING PLURALITY OF SUBSTRATES

(71) Applicant: Taiwan Semiconductor Manufacturing Company, Ltd., Hsin-Chu (TW)

(72) Inventors: Chin-Chuan Chang, Zhudong Township (TW); Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,366

(22) Filed: Aug. 22, 2016

(65) Prior Publication Data

US 2016/0358888 A1    Dec. 8, 2016

Related U.S. Application Data

(63) Continuation of application No. 14/586,524, filed on Dec. 30, 2014, now Pat. No. 9,425,128, which is a
(Continued)

(51) Int. Cl.
*H01L 23/34* (2006.01)
*H01R 9/00* (2006.01)
(Continued)

(52) U.S. Cl.
CPC ........ *H01L 25/0655* (2013.01); *H01L 21/486* (2013.01); *H01L 21/561* (2013.01);
(Continued)

(58) Field of Classification Search
CPC ........... H01L 23/49838; H01L 23/5389; H01L 24/06; H01L 25/0652; H01L 24/45;
(Continued)

(56) References Cited

U.S. PATENT DOCUMENTS

| 5,646,828 | A | 7/1997 | Degani et al. |
| 6,110,806 | A | 8/2000 | Pogge |

(Continued)

FOREIGN PATENT DOCUMENTS

| CN | 102938390 A | 2/2013 |
| KR | 1020080099045 A | 11/2008 |

(Continued)

*Primary Examiner* — Alonzo Chambliss
(74) *Attorney, Agent, or Firm* — Slater Matsil, LLP

(57) ABSTRACT

A package includes an interposer, which includes a first substrate free from through-vias therein, redistribution lines over the first substrate, and a first plurality of connectors over and electrically coupled to the redistribution lines. A first die is over and bonded to the first plurality of connectors. The first die includes a second substrate, and through-vias in the second substrate. A second die is over and bonded to the plurality of connectors. The first die and the second die are electrically coupled to each other through the redistribution lines. A second plurality of connectors is over the first die and the second die. The second plurality of connectors is electrically coupled to the first plurality of connectors through the through-vias in the second substrate.

20 Claims, 16 Drawing Sheets

Related U.S. Application Data continuation of application No. 13/789,866, filed on Mar. 8, 2013, now Pat. No. 8,933,551.

(51) Int. Cl.

| | | |
|---|---|---|
| *H01L 21/00* | (2006.01) | |
| *H01L 25/065* | (2006.01) | |
| *H01L 23/522* | (2006.01) | |
| *H01L 23/498* | (2006.01) | |
| *H01L 21/48* | (2006.01) | |
| *H01L 21/56* | (2006.01) | |
| *H01L 21/78* | (2006.01) | |
| *H01L 23/48* | (2006.01) | |
| *H01L 23/495* | (2006.01) | |
| *H01L 23/538* | (2006.01) | |
| *H01L 23/00* | (2006.01) | |
| *H01L 25/00* | (2006.01) | |
| *H01L 23/367* | (2006.01) | |
| *H01L 21/768* | (2006.01) | |
| *H01L 23/14* | (2006.01) | |
| *H01L 23/31* | (2006.01) | |

(52) U.S. Cl.
CPC ...... *H01L 21/563* (2013.01); *H01L 21/76898* (2013.01); *H01L 21/78* (2013.01); *H01L 23/3114* (2013.01); *H01L 23/367* (2013.01); *H01L 23/481* (2013.01); *H01L 23/498* (2013.01); *H01L 23/49541* (2013.01); *H01L 23/49811* (2013.01); *H01L 23/49816* (2013.01); *H01L 23/49827* (2013.01); *H01L 23/49838* (2013.01); *H01L 23/49872* (2013.01); *H01L 23/5226* (2013.01); *H01L 23/5384* (2013.01); *H01L 23/5389* (2013.01); *H01L 24/06* (2013.01); *H01L 24/16* (2013.01); *H01L 24/97* (2013.01); *H01L 25/0652* (2013.01); *H01L 25/0657* (2013.01); *H01L 25/50* (2013.01); *H01L 23/147* (2013.01); *H01L 23/3128* (2013.01); *H01L 24/81* (2013.01); *H01L 2224/0401* (2013.01); *H01L 2224/06137* (2013.01); *H01L 2225/06513* (2013.01); *H01L 2225/06541* (2013.01); *H01L 2225/06544* (2013.01); *H01L 2225/06555* (2013.01); *H01L 2225/06582* (2013.01); *H01L 2924/12042* (2013.01); *H01L 2924/15788* (2013.01); *H01L 2924/181* (2013.01)

(58) Field of Classification Search
CPC ....... H01L 24/46; H01L 23/481; H01L 24/97; H01L 25/18; H01L 25/0655; H01L 21/486; H01L 21/561; H01L 21/563; H01L 21/76898; H01L 21/78; H01L 23/3114; H01L 23/367; H01L 23/49541; H01L 23/49816; H01L 23/49827

See application file for complete search history.

(56) References Cited

U.S. PATENT DOCUMENTS

| | | | |
|---|---|---|---|
| 6,507,115 B1 | 1/2003 | Hofstee et al. | |
| 6,737,297 B2 | 5/2004 | Pogge et al. | |
| 6,889,155 B2* | 5/2005 | Ogino | H01L 23/49822 257/724 |
| 6,919,226 B2 | 7/2005 | Ogawa et al. | |
| 7,049,697 B2 | 5/2006 | Pogge et al. | |
| 8,435,835 B2 | 5/2013 | Pagaila et al. | |
| 8,654,119 B2 | 2/2014 | Mistretta et al. | |
| 8,803,332 B2 | 8/2014 | Lee et al. | |
| 8,933,551 B2 | 1/2015 | Chang et al. | |
| 9,425,128 B2* | 8/2016 | Chang | H01L 21/76898 |
| 2002/0149097 A1 | 10/2002 | Lee et al. | |
| 2008/0277800 A1 | 11/2008 | Hwang et al. | |
| 2010/0059898 A1 | 3/2010 | Keeth et al. | |
| 2011/0193235 A1 | 8/2011 | Hu et al. | |
| 2012/0056314 A1 | 3/2012 | Pagaila et al. | |
| 2013/0043599 A1 | 2/2013 | Huang et al. | |
| 2013/0049216 A1 | 2/2013 | Lin et al. | |
| 2014/0147972 A1* | 5/2014 | Semmelmeyer | H01L 25/0652 438/109 |
| 2014/0252579 A1 | 9/2014 | Chang et al. | |

FOREIGN PATENT DOCUMENTS

| | | |
|---|---|---|
| KR | 20110037169 A | 4/2011 |
| KR | 101184470 B1 | 9/2012 |
| TW | 201214649 A1 | 4/2012 |
| TW | 201308453 A1 | 2/2013 |
| TW | 201310586 A1 | 3/2013 |

\* cited by examiner

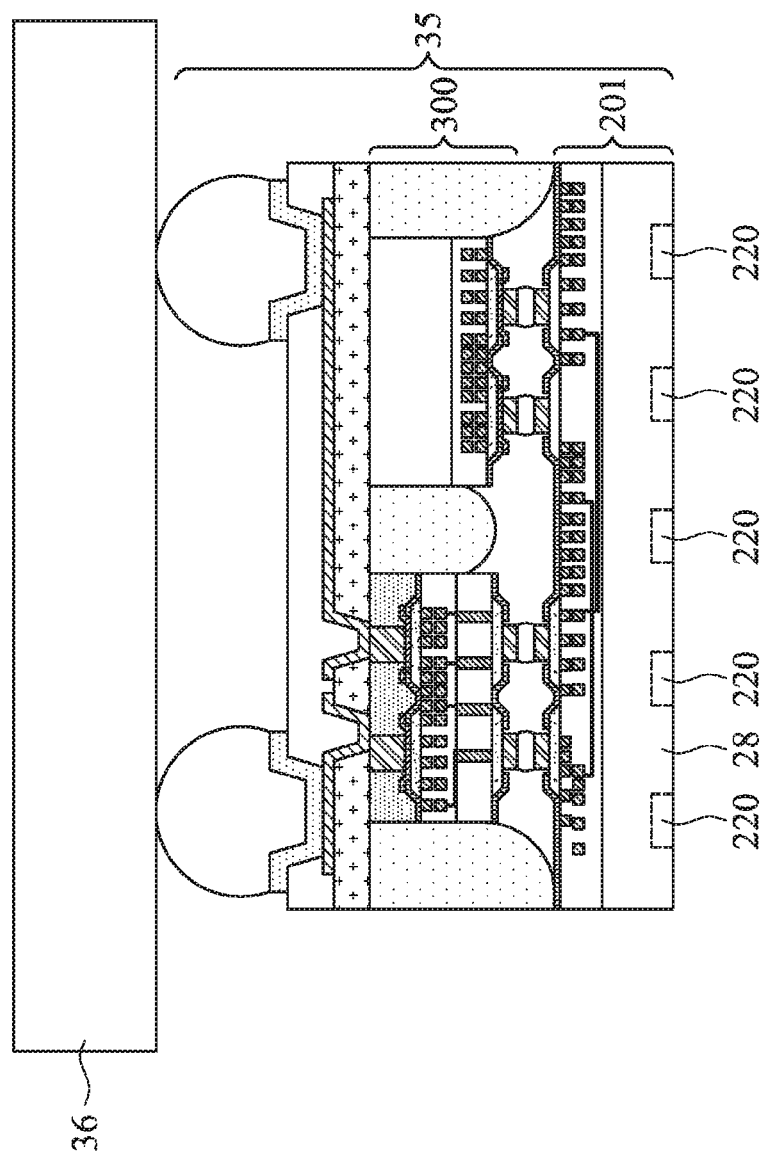

3-D PACKAGE HAVING PLURALITY OF SUBSTRATES

PRIORITY CLAIM AND CROSS-REFERENCE

This application is a continuation of U.S. patent application Ser. No. 14/586,524, entitled "3-D Package Having Plurality of Substrates," filed on Dec. 30, 2014, which application is a continuation of U.S. patent application Ser. No. 13/789,866, filed on Mar. 8, 2013, now U.S. Pat. No. 8,933,551, issued Jan. 13, 2015 entitled, "3D-Packages and Methods for Forming the Same," which applications are incorporated herein by reference.

BACKGROUND

In some Three-Dimensional Integrated Circuits (3DIC), device dies are first bonded to an interposer, which is further bonded to a package substrate to form a package. The heat generated in the device dies during their operation needs to be dissipated. In the conventional structures, to dissipate the heat, the substrates of the device dies are attached to a heat spreader, which has a size larger than the sizes of the device dies and the package substrate. Accordingly, the heat generated in the device dies is spread to a larger area. A heat sink is attached to the heat spreader to dissipate the heat conducted to the heat spreader.

The attachment of the device dies to the heat sink is through a Thermal Interface Material (TIM), which may include an epoxy-based material. In addition, some thermal conductive materials such as silicon particles may be mixed in the epoxy-based material to increase the thermal conductivity of the TIM. The attachment of the heat sink to the heat spreader is through another TIM. Due to the use of two TIMs, the efficiency in the heat dissipation is lowered.

Furthermore, conventional packages also face the challenge of increasingly reducing thicknesses, and improving the communication efficiency between the package components in the packages.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 1K are cross-sectional views of intermediate stages in the manufacturing of a face-to-back package in accordance with some exemplary embodiments;

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
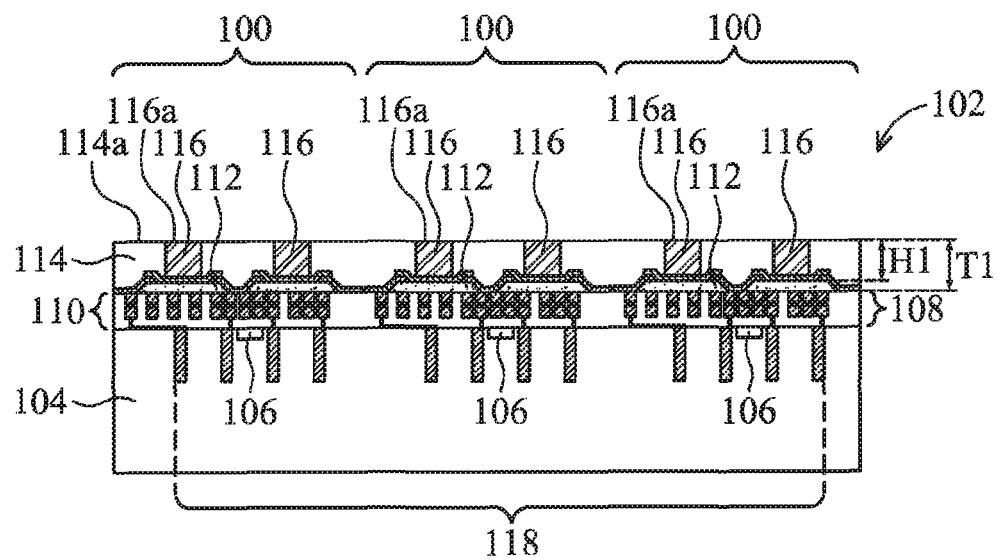

FIGS. 1A through 1K are cross-sectional views of intermediate stages in the manufacturing of a face-to-back package in accordance with some exemplary embodiments, in which a front side of an interposer is bonded to a backside of a device die and/or a backside of a memory die. FIGS. 1A through 1D illustrate the formation of device dies 100. Referring to FIG. 1A, device wafer 102 is formed. Device wafer 102 includes a plurality of identical device dies 100 therein. Device wafer 102 may include semiconductor substrate 104, and may include integrated circuit devices 106 and overlying interconnect structures 108 formed therein. For clarity, integrated circuit devices 106 are not shown in subsequent drawings, although they also exist. Semiconductor substrate 104 may be a silicon substrate, or may be formed of other semiconductor materials such as silicon germanium, silicon carbon, a III-V compound semiconductor, or the like. Interconnect structures 108 includes metal lines and vias 110, which are used to interconnect integrated circuit devices 106. Metal lines and vias 110 are illustrated schematically, and the detailed structures therein are not shown. Integrated circuit devices 106 may include active devices such as transistors. Device wafer 102 may thus be a logic device wafer, which comprises a plurality of logic dies 100. For clarity, integrated circuit devices 106 are not shown in subsequent drawings, although they also exist.

Metal pads 112 are formed in dies 100, and are electrically coupled to integrated circuit devices 106 through metal lines and vias 110. Metal pads 112 may comprise aluminum, copper, nickel, or combinations thereof. Dielectric layer 114 is formed over metal pads 112. Dielectric layer 114 may be a thick layer with thickness T1 greater than about 10 μm, which thickness T1 may be between about 10 μm and about 50 μm. The material of dielectric layer 114 may be selected from a polymer such as a solder resist, polybenzoxazole (PBO), benzocyclobutene (BCB), a molding compound, and the like. In alternative embodiments, dielectric layer 114 may comprise silicon oxide, silicon nitride, and the like.

Metal pillars 116 are formed in dielectric layer 114, and are electrically coupled to metal pads 112. In some embodiments, metal pillars 116 have bottom surfaces contacting the top surfaces of metal pads 112. Metal pillars 116 may comprise copper, and hence are alternatively referred to as copper pillars 116 throughout the description. However, other conductive materials such as nickel and/or aluminum may also be used in copper pillars 116. Height H1 of copper pillars 116 may also be greater than about 10 μm, and may be between about 10 μm and about 50 μm. In some embodiments, top surfaces 116a of copper pillars 116 are substantially level with top surface 114a of dielectric layer 114. In other embodiments, top surfaces 116a of copper pillars 116 are higher than top surface 114a, so that portions of copper pillars 116 protrude above top surface 114a. Through-vias 118, which are conductive vias, are formed in substrate 104, and are electrically coupled to metal pillars 116 through metal pads 112 and metal lines and vias 110. Throughout the description, through-vias 118 are alternatively referred to as Through-Substrate Vias (TSVs) or through-silicon vias.

Figure 1B:
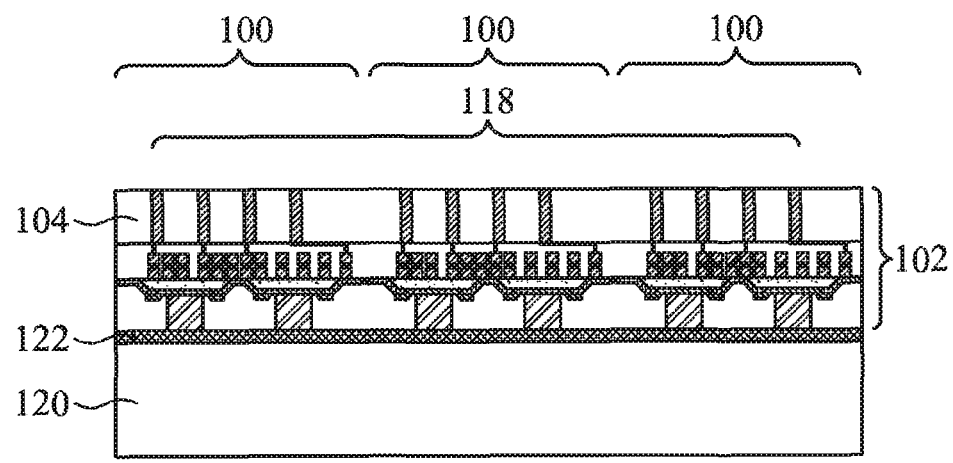

Next, referring to FIG. 1B, the front side of wafer 102 is mounted on carrier 120, for example, through adhesive 122.

Figure 1C:
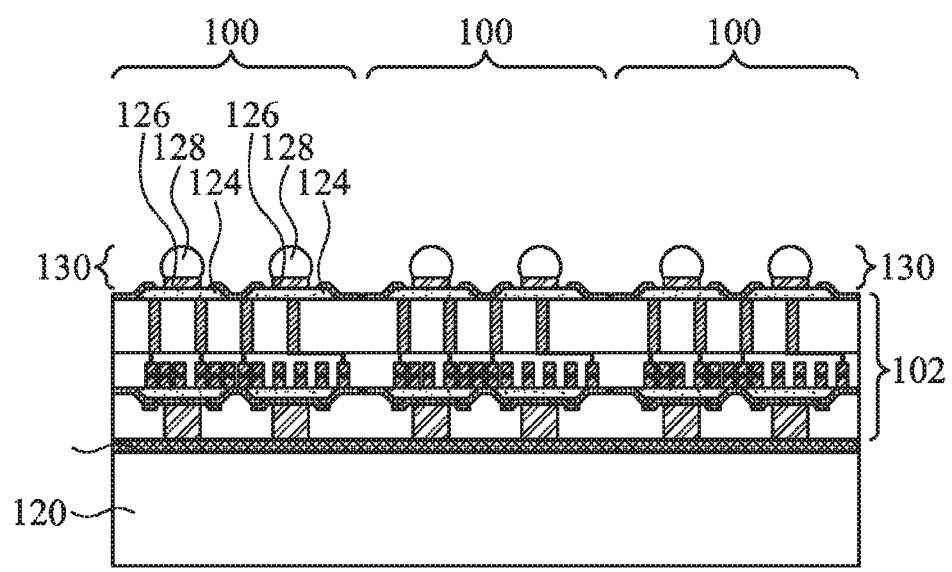

Carrier 120 may be a glass carrier, a ceramic carrier, an organic carrier, for example. Adhesive 122 may be a Ultra-Violet (UV) glue in some exemplary embodiments. A backside grinding is then performed to remove excess portions of substrate 104, until TSVs 118 are exposed. Next, as shown in FIG. 1C, connectors 130 are formed on the backside of substrate 104, and electrically coupled to TSVs 118. In some embodiments, connectors 130 include metal pads (or lines) 124, metal pillars 126, and solder balls 128. Additional redistribution lines (not shown) may also be formed on the backside of substrate 104. The additional redistribution lines interconnect connectors 130 and TSVs 118. Connectors 130 may also have other structures such as solder balls.

Figure 1D:
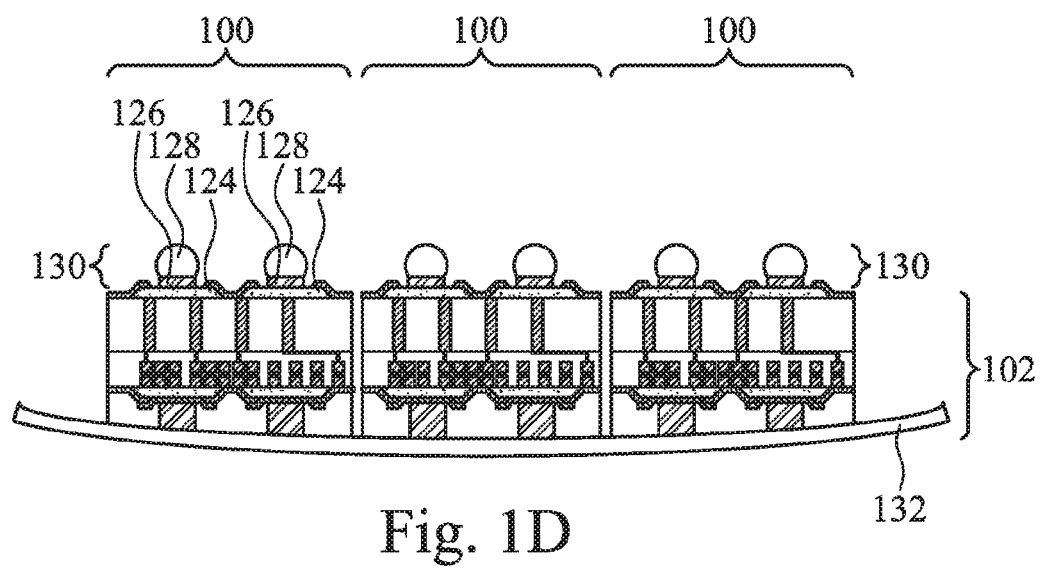

After the formation of the connectors 130, wafer 102 is demounted from carrier 120. Next, as shown in FIG. 1D, wafer 102 is sawed apart, so that dies 100 are separated from each other. In some embodiments, in order to saw wafer 102, wafer 102 is attached on dicing tape 132, and is diced when attached to dicing tape 132. The separated dies 100 are then detached from dicing tape 132.

Figure 1E:
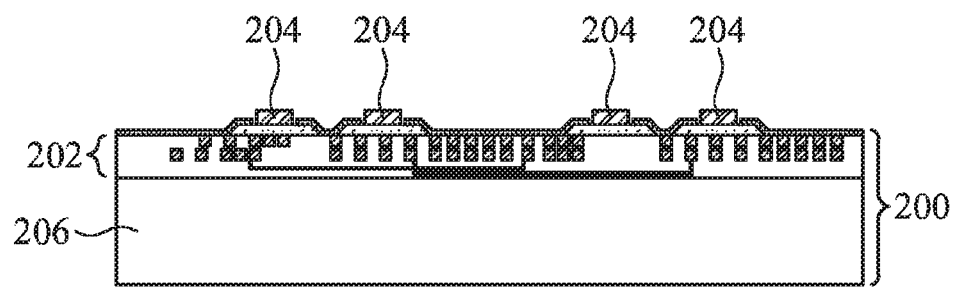

FIG. 1E illustrates interposer wafer 200, which includes redistribution lines 202, and connectors 204 connected to redistribution lines 202. Redistribution lines 202 are illustrated schematically, and the detailed structure therein is not shown. Redistribution lines 202 may include metal lines distributed in a plurality of layers, and vias interconnecting the metal lines of different layers. Redistribution lines 202 and connectors 204 are overlying substrate 206. Connectors 204 may include copper pillars, metal pads, solder layers, solders, and/or the like. In some embodiments, substrate 206 comprises a silicon substrate. In alternative embodiments, substrate 206 is a dielectric substrate such as a glass substrate.

Interposer wafer 200 may be free from active devices (such as transistors) and passive devices (such as inductors, resistors, and capacitors) in accordance with some embodiments. In alternative embodiments, interposer wafer 200 includes passive devices, and does not include active devices. In yet alternative embodiments, interposer wafer 200 include both active devices and passive devices therein. Interpose wafer 200 does not include TSVs therein. Accordingly, each of connectors 204 may eventually be connected to another one of connectors 204 through redistribution lines 202.

Figure 1F:
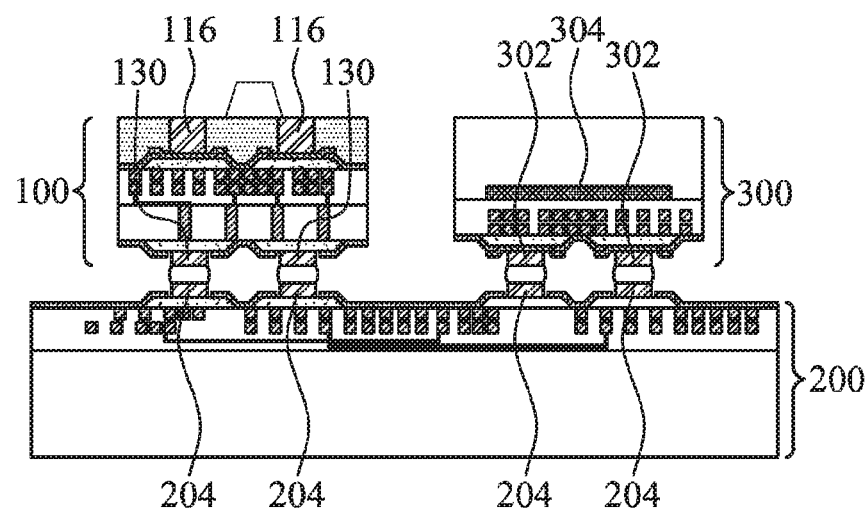

Referring to FIG. 1F, die 100 and 300 are bonded to interposer wafer 200. Although one die 100 and one die 300 is illustrated, there may be a plurality of identical dies 100 and a plurality of identical dies 300 bonded to interposer wafer 200. Connectors 130 of die 100 are bonded to connectors 204 of interposer wafer 200. The front side of interposer wafer 200 faces the back side of die 100, and hence the respective bonding is referred to as a face-to-back bonding.

Furthermore, die 300 includes connectors 302 bonded to connectors 204 of interposer wafer 200. Die 300 may be a memory die in some embodiments, although die 300 may also be a logic die. In some embodiments, die 300 includes memories 304, such as Dynamic Random Access Memories (DRAMs), Static Random Access Memories (SRAMs), or the like. Memories 304 are electrically coupled to connectors 204 in interposer wafer 200. Accordingly, through redistribution lines 202 and connectors 204 in interposer wafer 200, die 100 is electrically interconnected to die 300, and electrically coupled to memories 304.

Figure 1G:
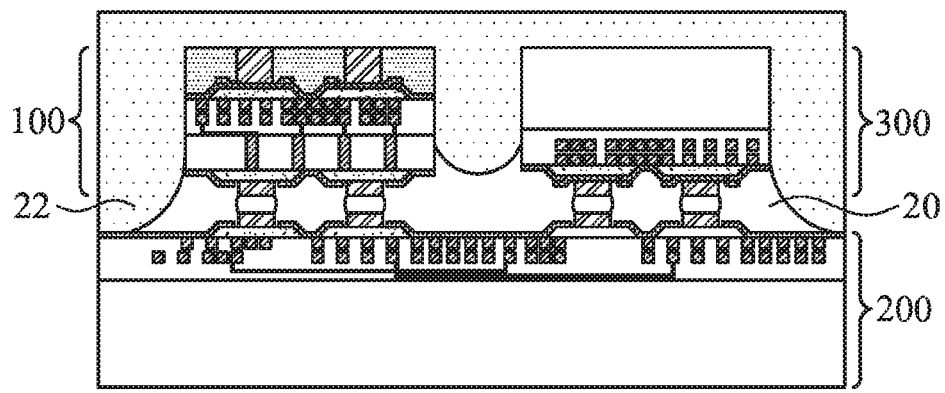

FIG. 1G illustrates the dispensing of underfill 20 into the gap between interposer wafer 200 and die 100, and into the gap between interposer wafer 200 and die 300. Furthermore, molding compound 22 is dispensed over dies 100 and 300 and interposer wafer 200, and into the spaces between dies 100 and 300. The top surfaces of dies 100 and 300 are also covered by molding compound 22. Curing processes are performed to solidify underfill 20 and molding compound 22. In alternative embodiments, underfill 20 and molding compound 22 are replaced by a molding underfill.

Figure 1H:
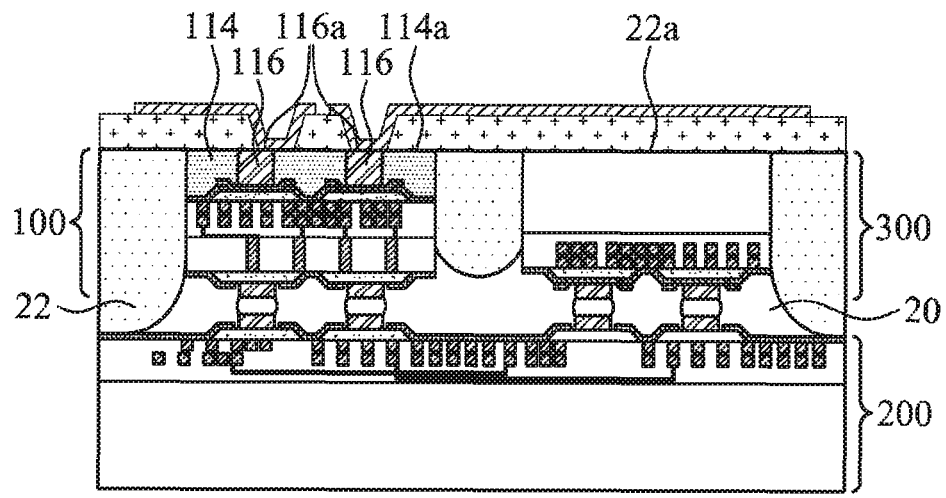

Referring to FIG. 1H, a planarization such as a grinding is performed on molding compound 22, until copper pillars 116, and possibly dielectric layer 114, are exposed. Accordingly, top surface 114a of dielectric layer 114, top surfaces 116a of copper pillars 116, and top surface 22a of molding compound 22 may be substantially level with each other. As a result of the grinding, no molding compound 22 is higher than die 100. When viewed from top, copper pillars 116 are surrounded by, and contacting, dielectric layer 114. Further, copper pillars 116 and dielectric layer 114 in each die 100 form an integrated component that is surrounded by molding compound 22.

Figure 1I:
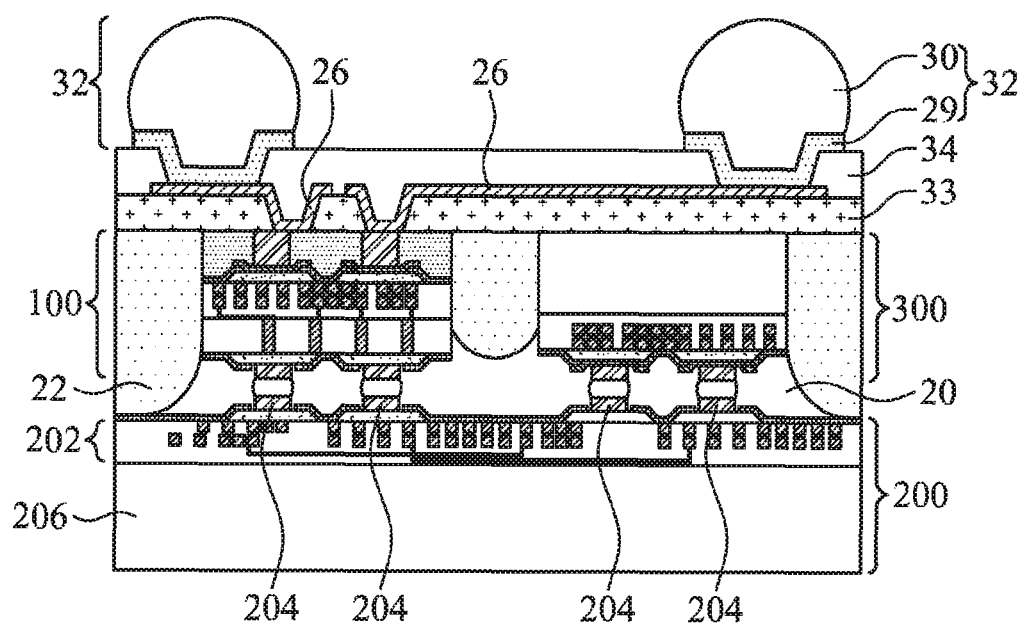

FIG. 1I illustrates the formation of conductive features 26, and connectors 32 electrically connected to conductive features 26. Conductive features 26 may comprise copper, tungsten, nickel, and/or the like. In some embodiments, dielectric layer 33 is formed over dies 100 and 300 and molding compound 22, followed by the patterning of dielectric layer 33, so that metal pillars 116 are exposed. Dielectric layer 34 is formed over dielectric layer 33 and conductive features 26. Dielectric layers 33 and 34 may be polymer layers in some embodiments, and may comprise polyimide, PBO, or the like. Openings are formed in dielectric layer 34 to expose conductive features 26. Connectors 32 are then formed in the openings to connect to conductive features 26. In some embodiments, connectors 32 include Under-Bump Metallurgies (UBMs) 29, and solder balls 30 over UBMs 29. In alternative embodiments, connectors 32 may have other structures such as copper pillars, pre-solder layers, and the like. Connectors 32 may thus be electrically coupled to connectors 204 in interposer wafer 200 through conductive features 26. Furthermore, connectors 32 may be electrically coupled to die 300 through connectors 204 and redistribution lines 202 in interposer wafer 200.

Figure 1J:
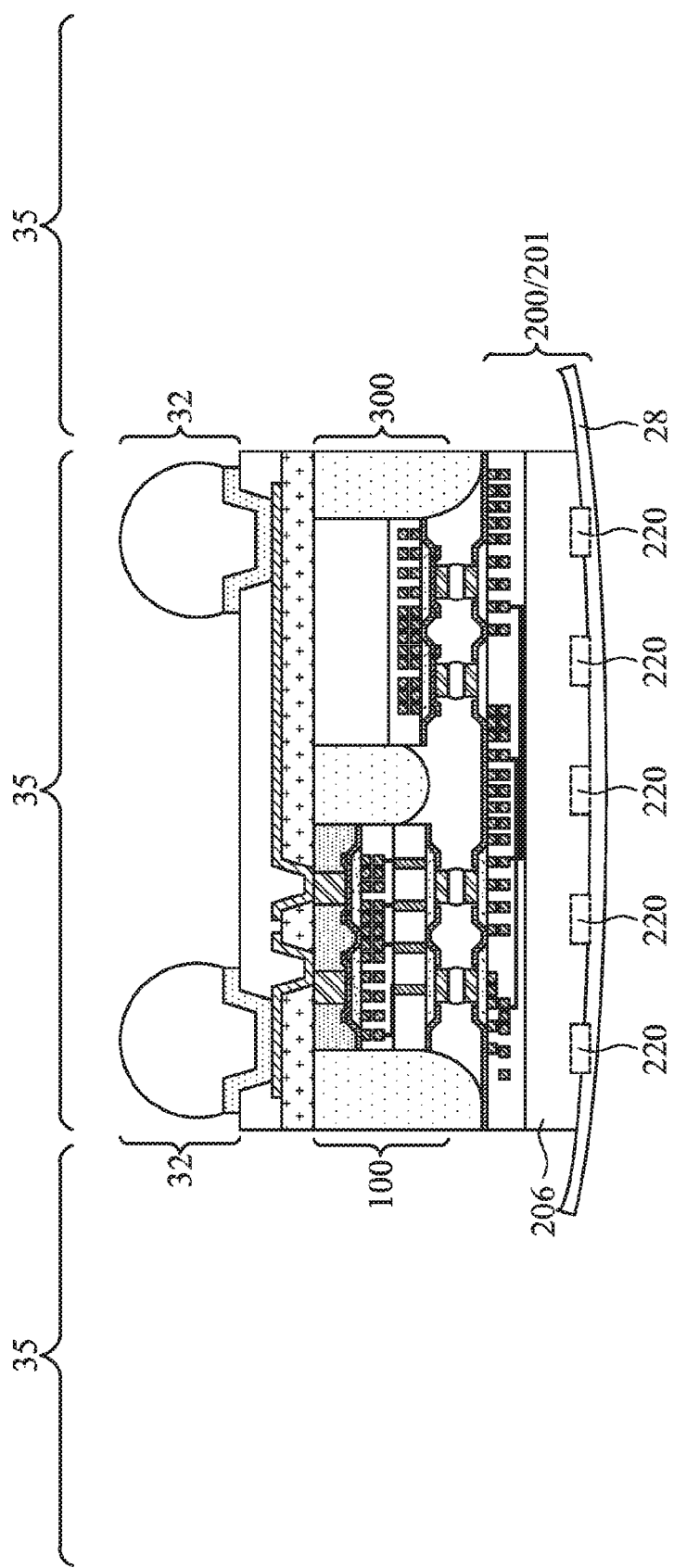

In FIG. 1J, substrate 206 of interposer wafer 200 is thinned, for example, through a grinding step. Wafer 200 is then attached to dicing tape 28, and interposer wafer 200 and the overlying dies 100 and 300 are diced into a plurality of packages 35. Each of packages 35 includes one piece of interposer wafer 200, which piece is referred to as interposer 201 hereinafter. Each of packages 35 also includes dies 100 and 300, which are interconnected through interposer 201. Packages 35 may then be detached from dicing tape 28.

In accordance with some embodiments, substrate 206 of interposer wafer 200 may be patterned to form trenches 220. The patterning may be performed at wafer level before the dicing step, and may be formed through, for example, laser grooving, etching, or the like. The patterning may also be formed before or after the thinning of substrate 206. Trenches 220 may be formed as a grid in a bottom view of interposer 201, and hence the remaining portions of substrate 206 form a plurality of protrusions encircled by trenches 220. Substrate 206 thus has good heat dissipation ability. In the resulting package, as shown in FIG. 1K (also shown in FIGS. 2I and 3F), the resulting interposer 201 may, or may not, include trenches 220 and protrusions.

FIG. 1K illustrates the bonding of package 35 to Printed Circuit Board (PCB) 36. In accordance with embodiments, connectors 32 are Ball Grid Array (BGA) balls, and hence may be bonded to PCB 36 directly, with no package substrate therebetween. Furthermore, interposer 201 acts as the heat dissipation element of the resulting package, and as the interconnection between dies 100 and 300.

FIGS. 2A through 2I and FIGS. 3A through 3F illustrate cross-sectional views of intermediate stages in the formation of a package in accordance with alternative embodiments. Unless specified otherwise, the materials and the formation methods of the components in these embodiments are essentially the same as the like components, which are denoted by like reference numerals in the embodiments shown in FIGS. 1A through 1K. The details regarding the formation process and the materials of the components shown in FIGS. 2A through 2I and FIGS. 3A through 3F may thus be found in the discussion of the embodiments shown in FIGS. 1A through 1K.

Figure 2A:
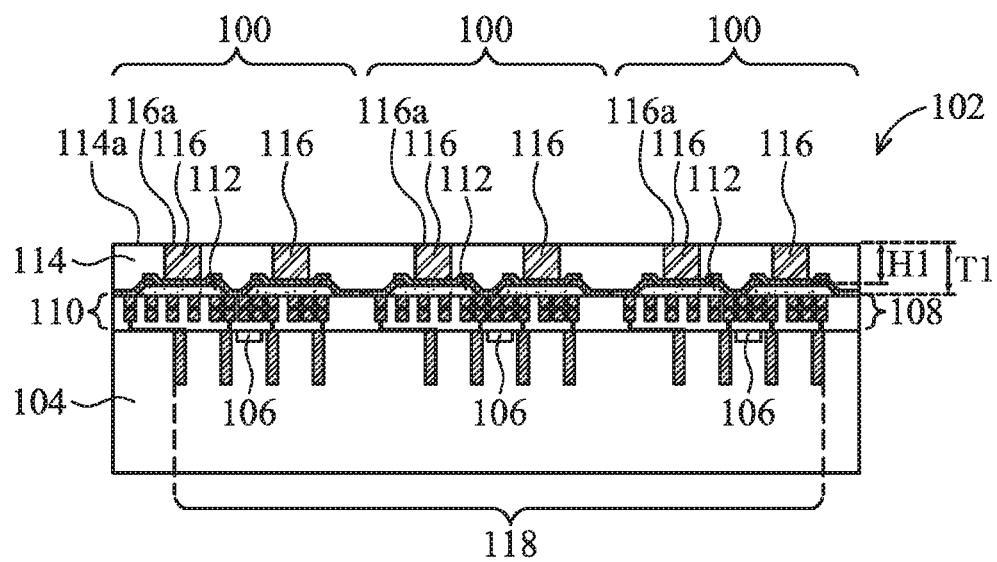
FIGS. 2A through 2I are cross-sectional views of intermediate stages in the manufacturing of a face-to-face heterogeneous package in accordance with some exemplary embodiments.
Figure 2B:
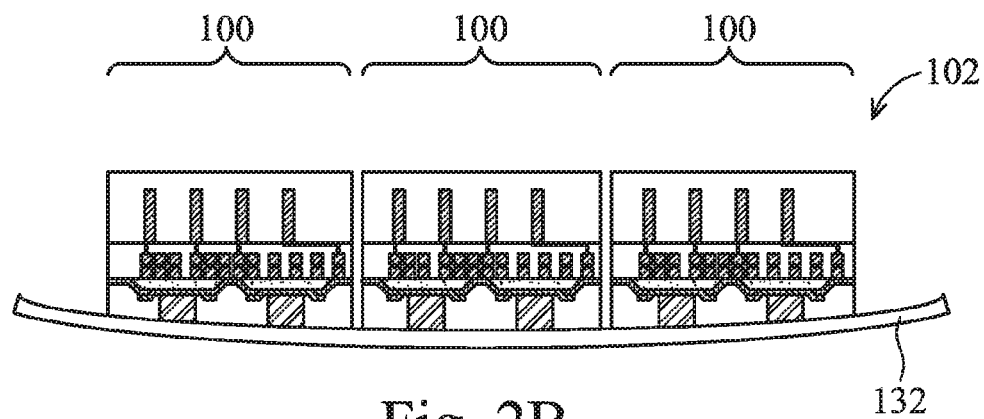

FIGS. 2A and 2B illustrate the preparation of dies 100. Referring to FIG. 2A, device wafer 102 is formed. Device wafer 102 is essentially the same as shown in FIG. 1A, and hence the details of device wafer 102 are not repeated herein. Next, referring to FIG. 2B, device wafer 102 is diced into dies 100. At this time, the formation of dies 100 are not finished yet, and the remaining formation process steps of dies 100 are illustrated in subsequent drawings.

Figure 2C:
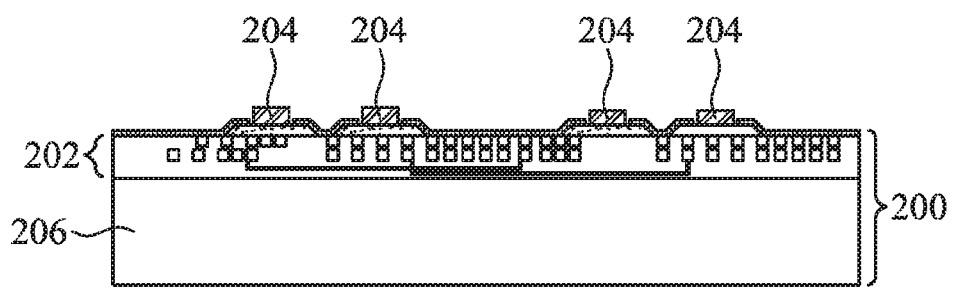
Figure 2D:
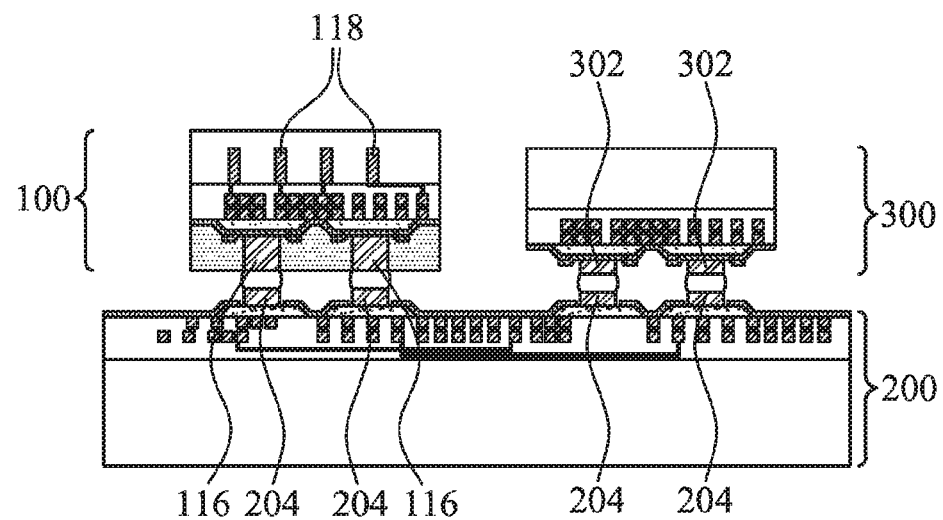

In FIG. 2C, interposer wafer 200 is formed. Interposer wafer 200 is essentially the same as shown in FIG. 1E, and hence the details of interposer wafer 200 are not repeated herein. In FIG. 2D, dies 100 and 300 are bonded to interposer wafer 200, with copper pillars 116 in dies 100 and connectors 302 in die 300 bonded to interposer wafer 200. Again, a plurality of dies 100 and a plurality of die 300 are bonded to interposer wafer 200, although one die 100 and one die 300 are shown. In these embodiments, the front side of interposer wafer 200 faces the front side of die 100, and hence the respective bonding is referred to as a face-to-face bonding.

Figure 2E:
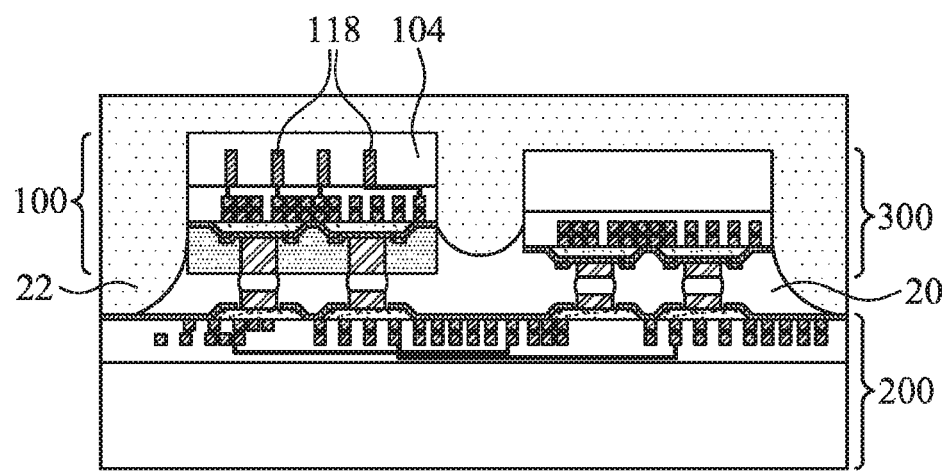
Figure 2F:
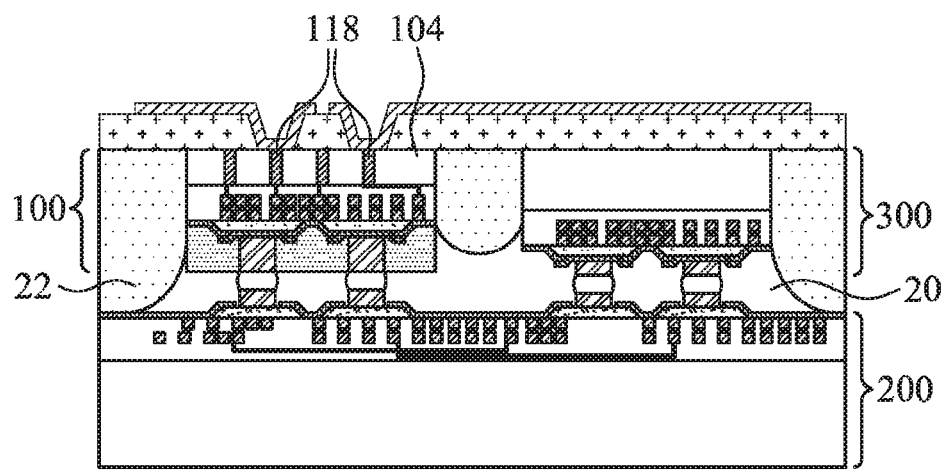

Next, as shown in FIG. 2E, underfill 20 and molding compound 22 are dispensed, wherein the top surface of molding compound 22 is higher than the dies 100 and 300. A planarization is then performed, for example, through a Chemical Mechanical Polish (CMP), as shown in FIG. 2F. The CMP is performed until the back ends of TSVs 118 are exposed. In these embodiments, there may be a layer of molding compound 22 overlapping die 300 in some embodiments. In alternative embodiments, after the grinding, the back surface of die 300 is also exposed.

Figure 2G:
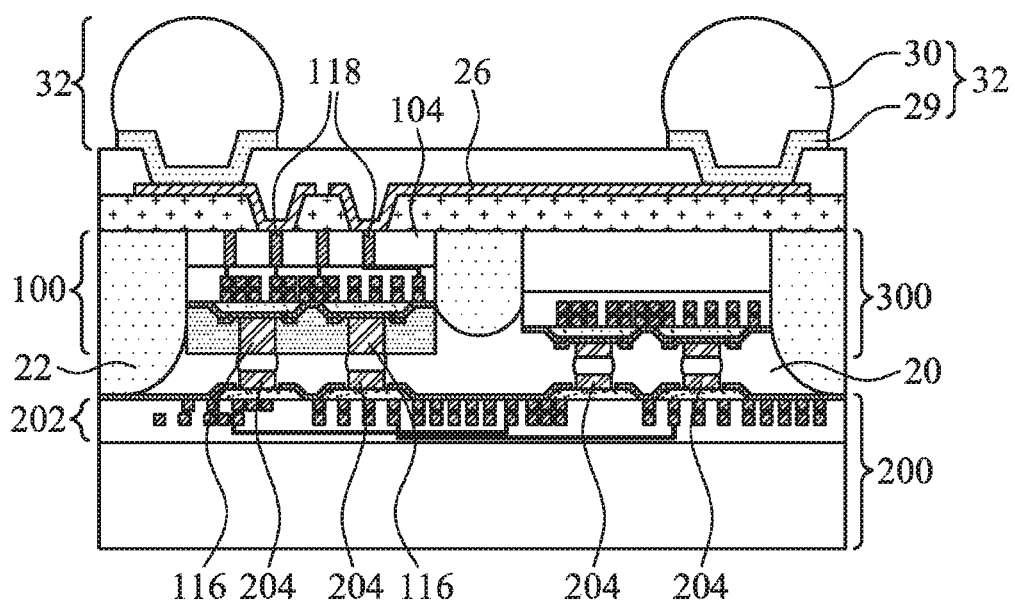
Figure 2H:
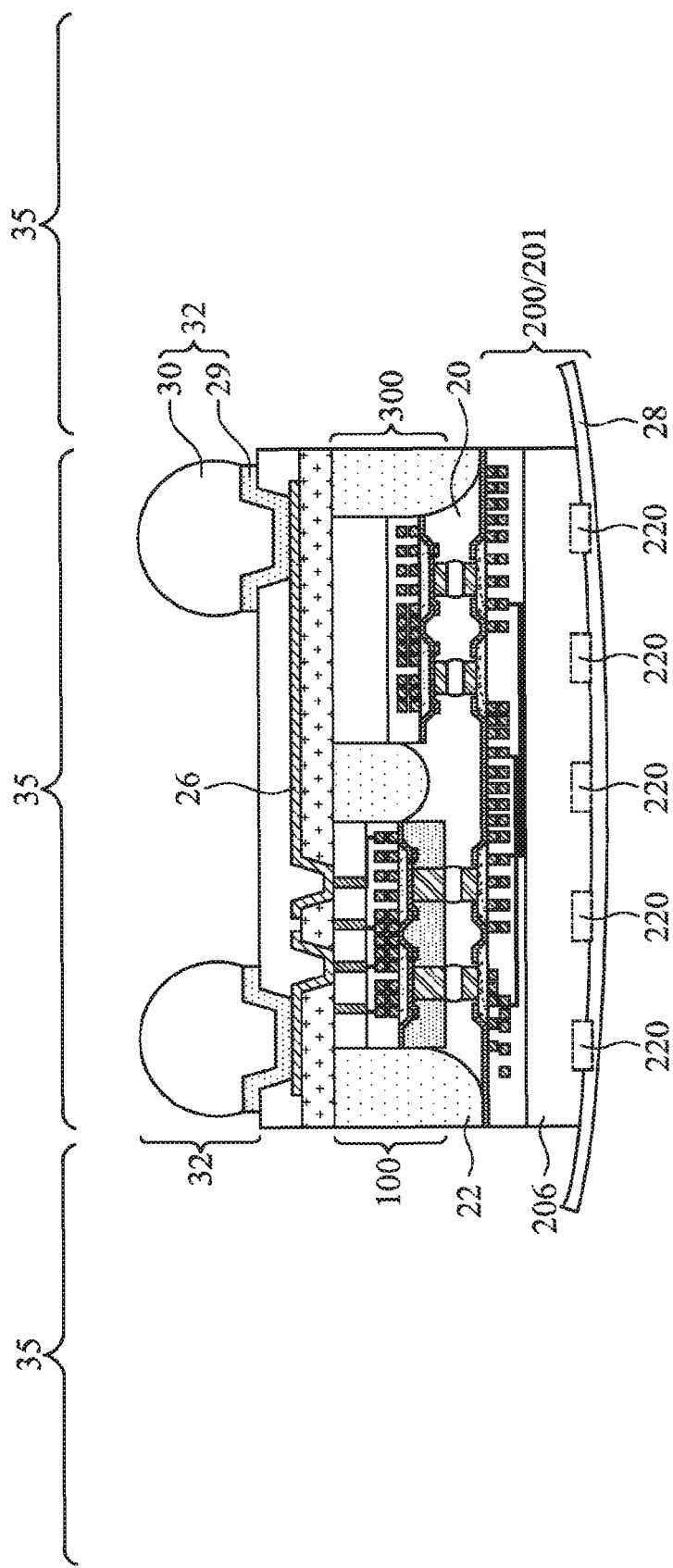
Figure 2I:
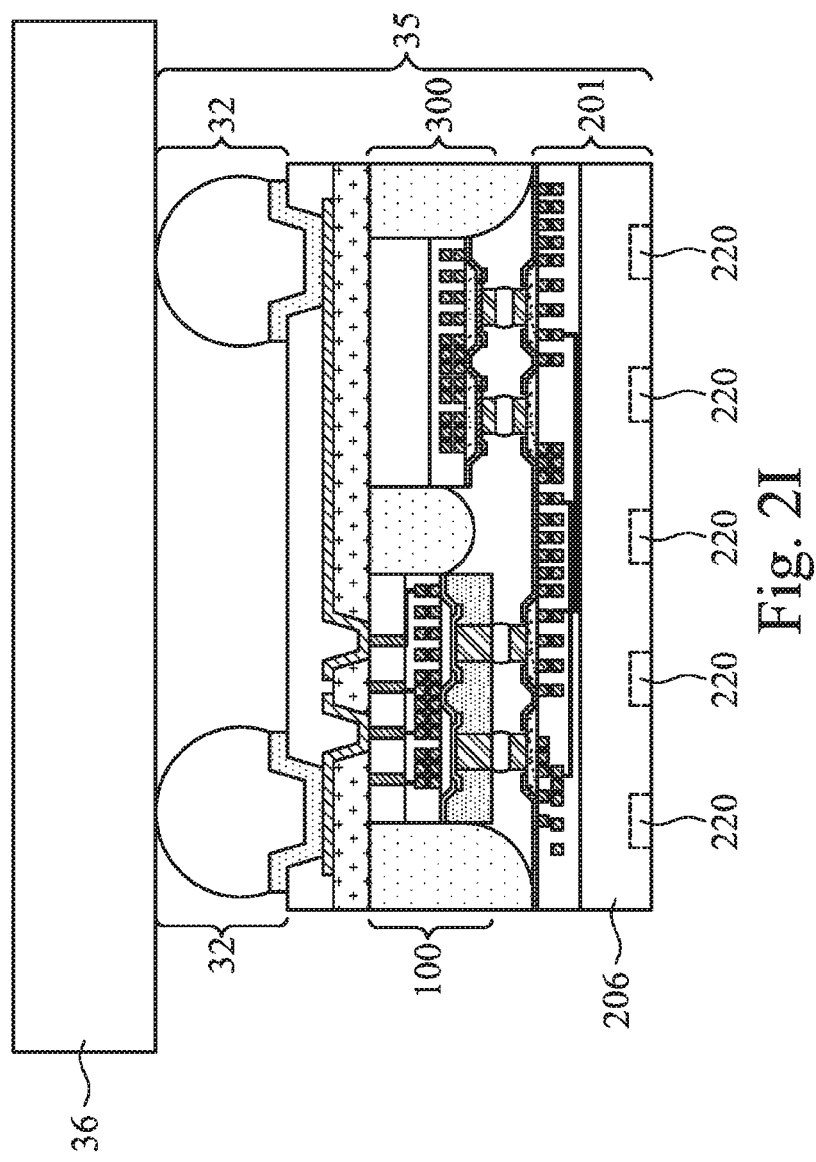

Referring to FIG. 2G, conductive features 26, dielectric layers 33 and 34, and connectors 32 are formed. Connectors 32 may thus be electrically coupled to connectors 204 in interposer wafer 200 through TSVs 118. Furthermore, connectors 32 may thus be electrically coupled to die 300 through connectors 204 and redistribution lines 202 in interposer wafer 200. FIGS. 2H and 2I illustrates the thinning of substrate 206 in interposer wafer 200, the attachment of interposer wafer 200 onto dicing tape 28, and the dicing step. Packages 35 (FIG. 2H) are hence formed. Next, as shown in FIG. 2I, package 35 is bonded to PCB 36.

In the embodiments shown in FIG. 2I, die 300, which may be a memory die, does not include TSVs therein, and hence the electrical interconnection between connectors 32 and interposer 201 is through die 100, and not through die 300. In alternative embodiments, TSVs may also be formed in die 300, and both dies 100 and 300 may be used as the interconnection paths for interconnecting connectors 32 and interposer 201. FIGS. 3A through 3G illustrate the intermediate stages in the respective formation process.

Figure 3A:
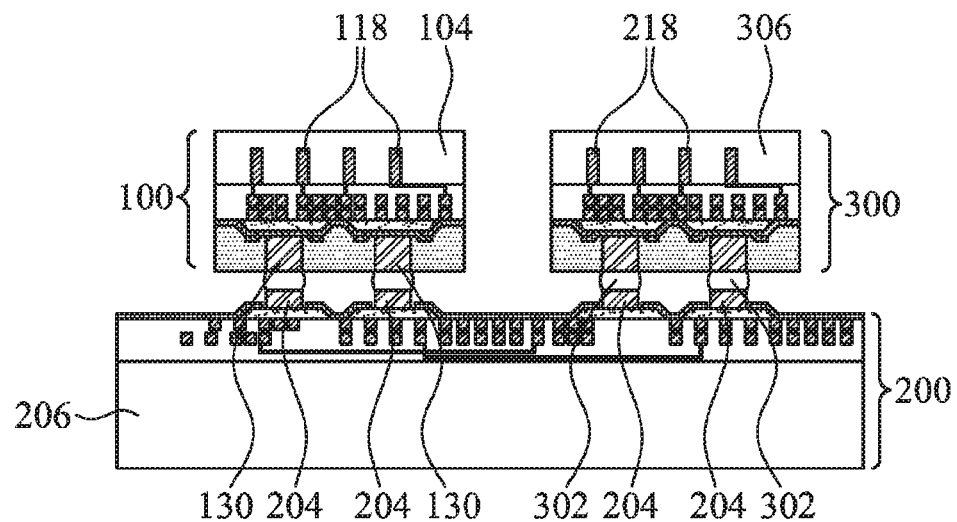
FIGS. 3A through 3F are cross-sectional views of intermediate stages in the manufacturing of a face-to-face homogeneous package in accordance with some exemplary embodiments.

Referring to FIG. 3A, dies 100 and 300 are bonded to interposer wafer 200. In these embodiments, the front sides of dies 100 and 300 are bonded to the front side of interposer wafer 200, and hence the respective bonding is referred to as a face-to-face bonding. TSVs 118 are embedded in substrate 104, and TSVs 218 are embedded in substrate 306 in die 300. Substrate 306 may be a semiconductor substrate such as a silicon substrate.

Figure 3B:
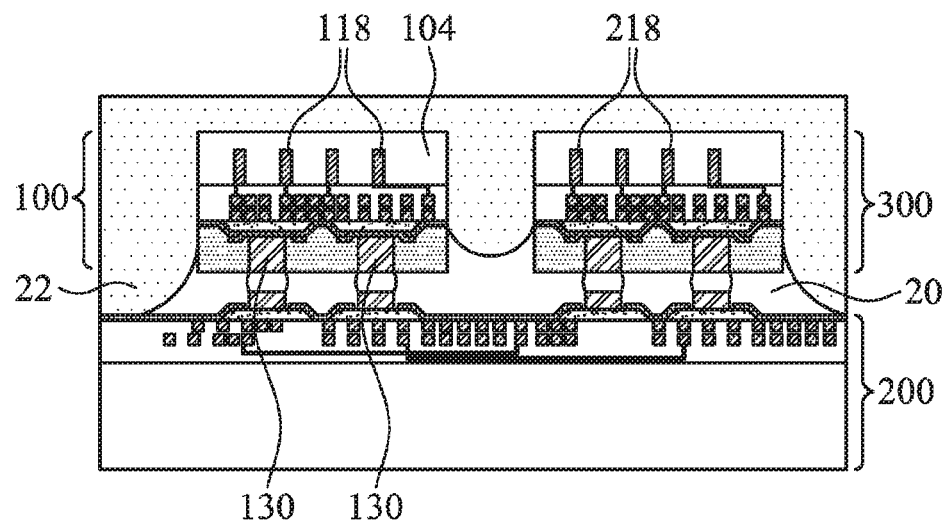
Figure 3C:
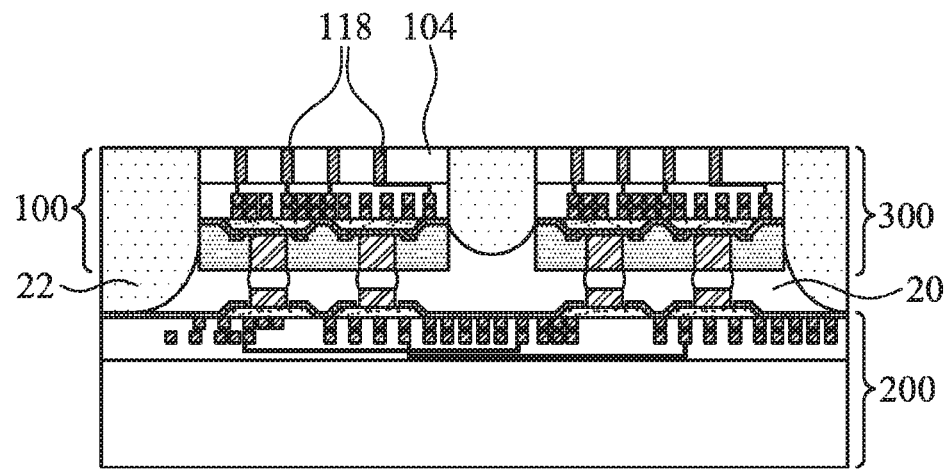

Next, referring to FIG. 3B, underfill 20 and molding compound 22 are dispensed and cured, wherein the top surface of molding compound 22 is higher than the top surface of dies 100 and 300. A planarization is then performed, for example, through a CMP. The resulting structure is shown in FIG. 3C. The CMP is performed until substrates 104 and 306 are exposed, and the CMP is continued so that the back ends of TSVs 118 and 218 are all exposed.

Figure 3D:
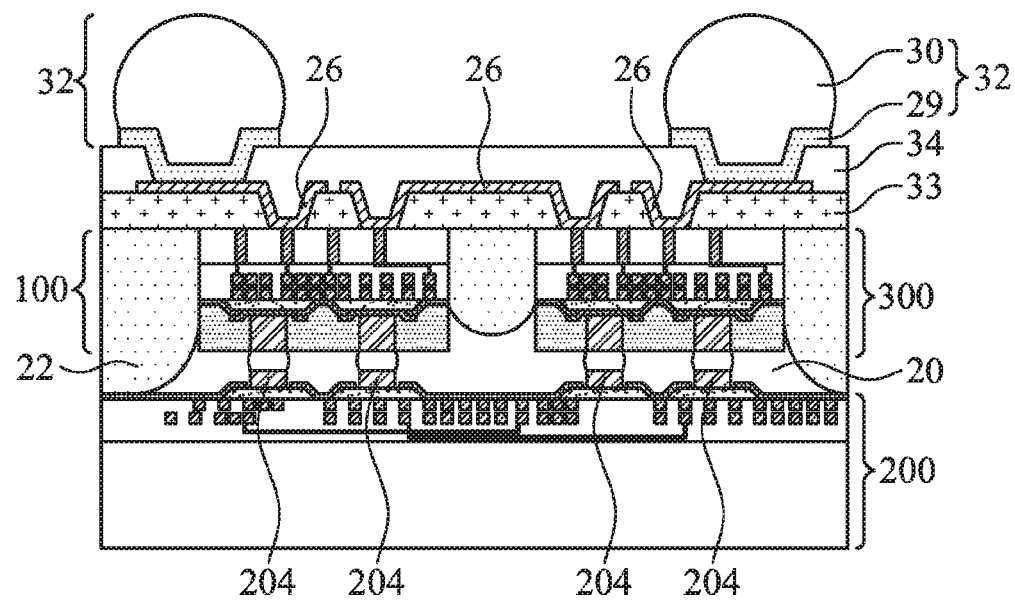
Figure 3E:
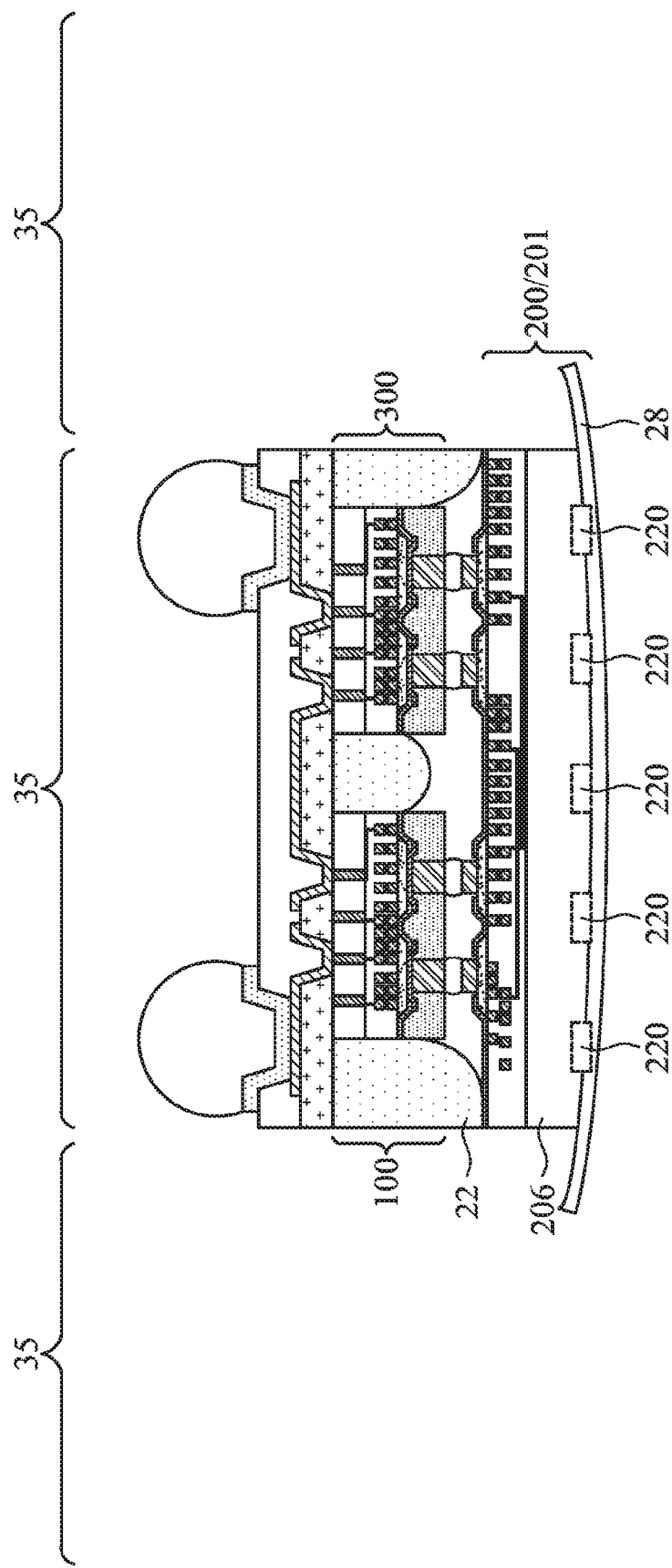
Figure 3F:
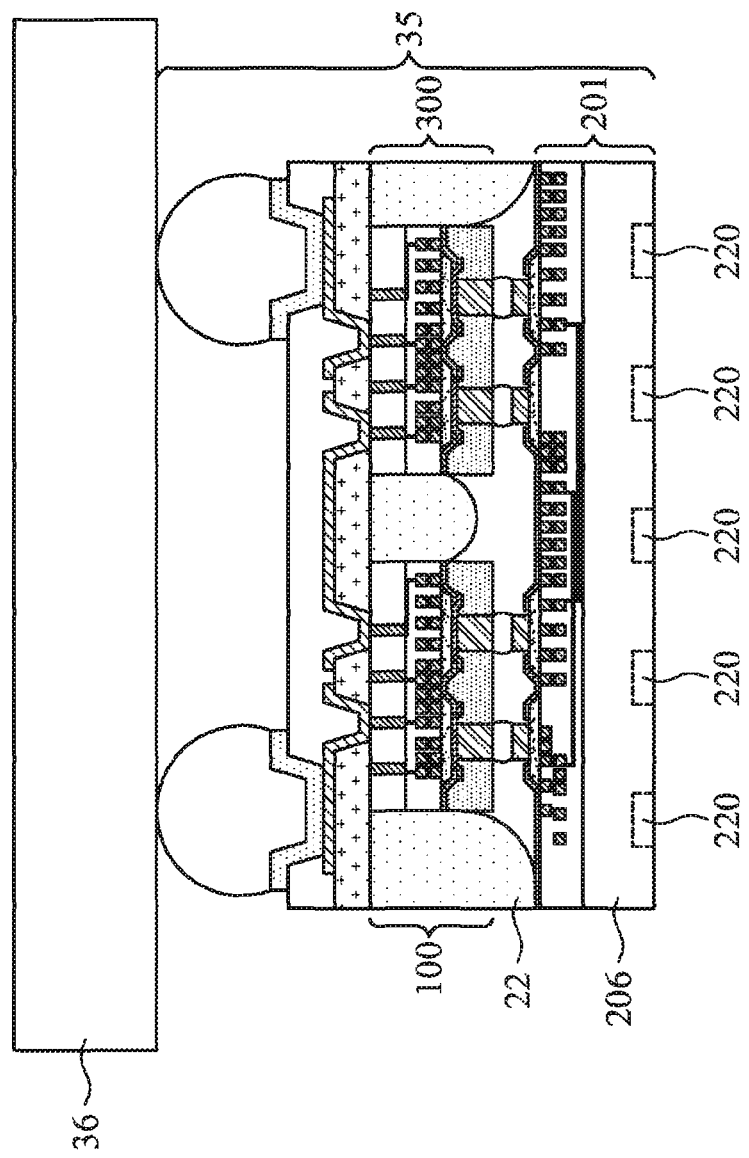

Referring to FIG. 3D, conductive features 26, dielectric layers 33 and 34, and connectors 32 are formed. Connectors 32 may thus be electrically coupled to connectors 204 in interposer wafer 200. FIGS. 3E and 3F illustrate the thinning of substrate 206 in interposer wafer 200, the attachment of interposer wafer 200 onto dicing tape 28, and the dicing of the structure. Packages 35 are hence formed. Next, as shown in FIG. 3F, package 35 is bonded to PCB 36.

Figure 4:
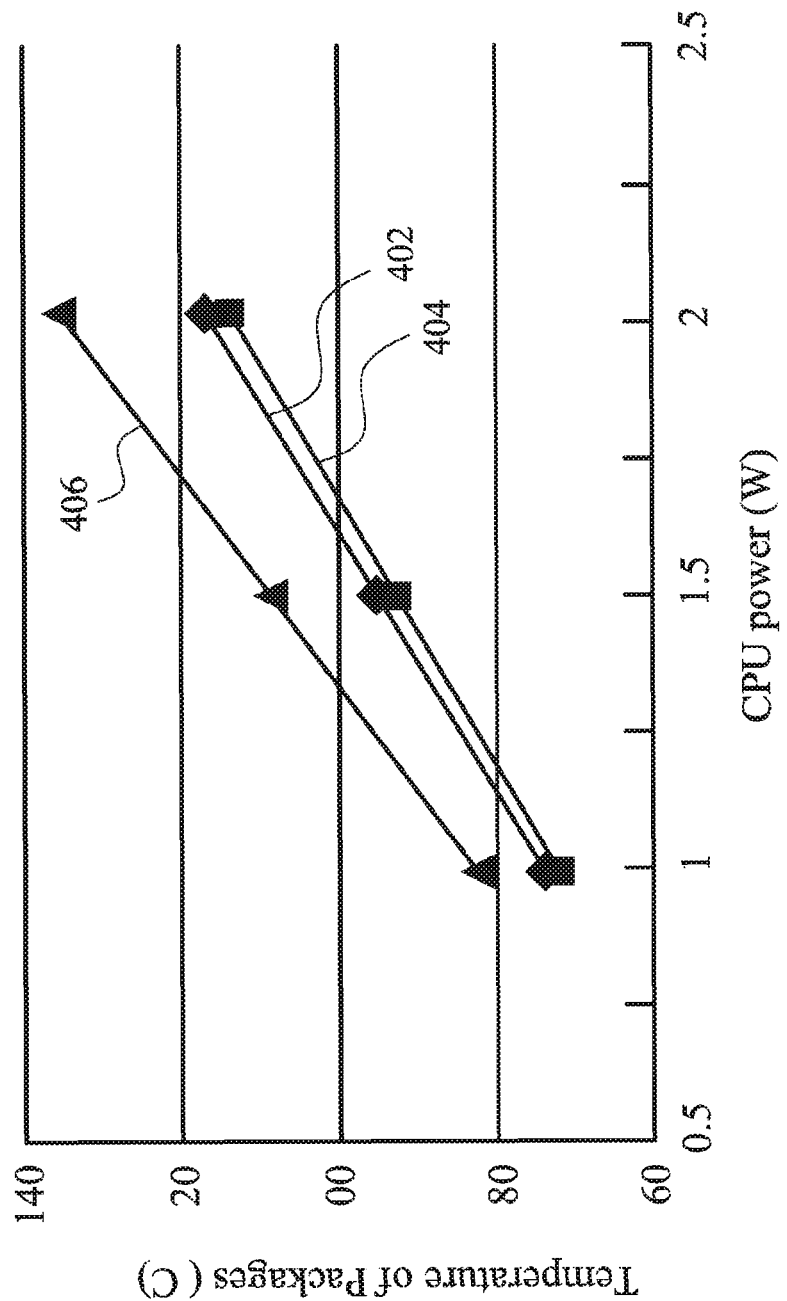
FIG. 4 illustrates the temperatures of sample packages (when powered up) as a function of the power of the CPU dies in the sample packages.

In the embodiments of the present disclosure, the interposers have the function of interconnecting the dies bonded thereon. The interposers, however, do not have TSVs therein. Accordingly, the interposers are not electrically coupled to any package component that is on the opposite side of the dies. The Interposers may thus be used as heat dissipation elements. Simulation results indicated that the heat dissipating ability of the interposers (having silicon substrates) are essentially the same as metal lids that could be attached to dies through TIMs. For example, FIG. 4 illustrates the comparison of the simulation results of three sample packages. The first sample package includes the structure shown in FIG. 1K, with an additional thermal pad bonded to the interposer 201 in FIG. 1K, and an additional metal Electro-Magnetic Interference (EMI) shield attached to the thermal pad. In the second sample package, a Thermal Interface Material (TIM) and a lid replace the interposer 201 in FIG. 1K. In the third sample package, a layer of molding compound, which may be the same as molding compound 22 (FIG. 1G), replaces the interposer 201 in FIG. 1K. The remaining components of the first, the second, and the third sample packages are the same as each other. The simulation results are illustrated in FIG. 4, wherein the temperatures of the sample packages (when powered up) are illustrated as a function of the power of die 100 (FIG. 1K), which is a CPU die in the simulation. The results of the first, the second, and the third sample packages are shown as lines 402, 404, and 406, respectively. The results indicate that the third sample package has the highest temperatures, indicating that the third sample package has the worst heat dissipating ability among three sample packages. The temperature of the first and the second sample packages are close to each other, indicating the packages of the embodiments of the present disclosure have heat dissipating ability as good as the second sample package that adopts the metal lid. The first sample package, however, have better metal routing ability than the second sample package. FIG. 4 further illustrates that with the increase in the CPU power, the first and the second packages still have heat dissipating ability close to each other.

In addition, simulation results indicated that when the thickness of the substrate in the interposer is reduced from 775 μm to 250 μm, the temperatures of the respective packages that have the structures in FIG. 1K, 2I or 3F increases from about 75° C. to about 77° C., which means that the overall thickness of the package may be reduced significantly without sacrificing the heat dissipating ability of the packages. In addition, simulation was also performed to compare sample packages incorporating the metal EMI shield with the sample packages without incorporating the EMI shield, wherein the simulated sample packages include the interposers (such as 201 in FIG. 1K) and CPU dies (such as die 100 in FIG. 1K) in accordance with the embodiments of the present disclosure. The simulation results indicated that the sample packages incorporating the EMI shield may have temperatures (with the CPU dies in the packages powered on) ranging from about 74.8° C. to about 77.2° C. As a comparison, the sample packages without incorporating the EMI shield may have temperatures (with CPU dies in the packages powered on) ranging from about 77.2° C. to about 79.2° C. Hence the temperatures of the packages increase only by between about 2 degrees and about 3 degrees when the EMI shields are removed from the packages. This indicates that the heat dissipating ability of the packages incorporating the interposers is already good enough, and hence the EMI shield has little effect on the heat dissipating ability.

In accordance with some embodiments, a package includes an interposer, which includes a first substrate free from through-vias therein, redistribution lines over the first substrate, and a first plurality of connectors over and electrically coupled to the redistribution lines. A first die is over and bonded to the first plurality of connectors. The first die includes a second substrate, and through-vias in the second substrate. A second die is over and bonded to the plurality of connectors. The first die and the second die are electrically coupled to each other through the redistribution lines. A second plurality of connectors is over the first die and the second die. The second plurality of connectors is electrically coupled to the first plurality of connectors through the through-vias in the second substrate.

In accordance with other embodiments, a package includes an interposer free from active devices therein. The interposer includes a silicon substrate free from through-vias therein, redistribution lines over the silicon substrate, and a first plurality of connectors over and electrically coupled to the redistribution lines. A first die is over and bonded to the plurality of connectors. The first die includes a first semiconductor substrate, a first plurality of through-vias in the first semiconductor substrate, and metal pillars electrically coupled to the first plurality of through-vias. A second die is over and bonded to the plurality of connectors, wherein the first die and the second die are electrically coupled to each other through the redistribution lines. A molding material surrounds the first die and the second die. The molding material includes a top surface level with a top surface of the first die. A second plurality of connectors is over the first die and the second die. The second plurality of connectors is electrically coupled to the first plurality of connectors through the first plurality of through-vias and the metal pillars in the first semiconductor substrate.

In accordance with yet other embodiments, a method includes bonding a first die onto a front surface of an interposer wafer. The interposer wafer is free from through-vias in a first substrate of the interposer wafer. The first die includes a first plurality of through-vias in a second substrate of the first die. A molding material is dispensed over the interposer wafer, with the first die molded in the molding material. A planarization is performed to level a top surface of the molding material with a top surface of the first die, until conductive features in the first die are exposed, wherein the conductive features are electrically coupled to the interposer wafer. Redistribution lines are formed over the molding material and the first die, wherein the redistribution lines are electrically coupled to the conductive features. Connectors are formed to electrically couple to the redistribution lines.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    an interposer comprising:
        a first substrate;
        first redistribution lines over the first substrate; and
        a first plurality of connectors over and electrically coupled to the first redistribution lines;
    a first die over and bonded to the first plurality of connectors, wherein the first die comprises:
        a second substrate; and
        first through-vias in the second substrate;
    a second die over and bonded to the first plurality of connectors, wherein the second die comprises:
        a third substrate; and
        second through-vias in the second substrate, wherein the first die and the second die are electrically coupled to each other through the first redistribution lines; and
    second redistribution lines over the first die and the second die, wherein the second redistribution lines electrically couple the first through-vias to the second through-vias.

2. The package of claim 1, wherein the interposer is free from active devices.

3. The package of claim 1, wherein the first substrate comprises a plurality of trenches extending from a bottom surface of the first substrate into the first substrate.

4. The package of claim 1, wherein the first substrate is overlapped by both the second substrate and the third substrate.

5. The package of claim 1, wherein the first substrate comprises a dielectric substrate.

6. The package of claim 1, wherein the first substrate comprises a silicon substrate, with no through-via penetrating through the first substrate.

7. The package of claim 1 further comprising:
    an encapsulating material surrounding the first die and the second die, wherein the encapsulating material comprises a top surface coplanar with both a top surface of the second substrate and a top surface of the third substrate; and a dielectric layer over and in contact with the second substrate, the third substrate, and the encapsulating material, wherein the second redistribution lines extends into the dielectric layer to electrically couple to the first die.

8. The package of claim 1, wherein the first die is bonded to the interposer through a face-to-back bonding, with a top surface of the first die comprising a top surface of the second substrate.

9. A package comprising:
an interposer free from active devices therein, the interposer comprising:
a first substrate comprising a plurality of trenches extending from a bottom surface of the first substrate into the first substrate, wherein the plurality of trenches is free from conductive materials filled therein;
first redistribution lines over the first substrate; and
a first plurality of connectors over and electrically coupling to the first redistribution lines.

10. The package of claim 9, wherein the plurality of trenches forms a grid in a bottom view of the package.

11. The package of claim 9, wherein the first substrate comprises a silicon substrate, and no through-via is formed to penetrate through the first substrate.

12. The package of claim 9 further comprising:
a first die over and bonded to the first plurality of connectors, wherein the first die comprises:
a second substrate; and
through-vias penetrating through the second substrate;
a second die over and bonded to the first plurality of connectors, wherein the first die and the second die are electrically coupled to each other through the first redistribution lines; and
second redistribution lines over the first die and the second die, wherein the second redistribution lines are electrically coupled to the second die through the through-vias and the first redistribution lines.

13. The package of claim 12 further comprising:
an encapsulating material surrounding the first die and the second die, wherein the encapsulating material comprises a top surface level with a top surface of the second substrate; and
a dielectric layer over and in contact with both the second substrate, a semiconductor substrate of the second die, and the encapsulating material, wherein the second redistribution lines comprise portions extending into the dielectric layer.

14. The package of claim 12, wherein the second die is free from through-vias.

15. The package of claim 12, wherein the second die further comprises additional through-vias.

16. The package of claim 9, wherein the plurality of trenches extends from the bottom surface to an intermediate level between the bottom surface and a top surface of the first substrate.

17. A package comprising:
an interposer comprising:
a first substrate free from through-vias;
first redistribution lines over the first substrate; and
a first electrical connector and a second electrical connector over the first redistribution lines, wherein the first redistribution lines comprise a redistribution line electrically inter-coupling the first electrical connector and the second electrical connector;
a first die over and bonded to the interposer, wherein the first die is bonded to the first electrical connector, and the first die comprises;
a second substrate; and
first through-vias in the second substrate and electrically coupling to the interposer; and
a second die over and bonded to the interposer, wherein the second die is bonded to the second electrical connector.

18. The package of claim 17, wherein the first die is electrically coupling to the second die through the redistribution line.

19. The package of claim 17 further comprising:
a dielectric layer over and physically contacting the second substrate and a third substrate of the second die; and
second redistribution lines comprising first portions over the dielectric layer, and second portions extending into the dielectric layer.

20. The package of claim 19, wherein the second die further comprises:
second through-vias in the third substrate, wherein the first die and the second die are electrically coupled to each other through the second redistribution lines.

* * * * *